United States Patent
Kim et al.

(10) Patent No.: US 10,283,257 B2
(45) Date of Patent: May 7, 2019

(54) SKEWED CO-SPIRAL INDUCTOR STRUCTURE

(71) Applicant: QUALCOMM Incorporated, San Diego, CA (US)

(72) Inventors: Daeik Daniel Kim, Del Mar, CA (US); David Francis Berdy, San Diego, CA (US); Chengjie Zuo, San Diego, CA (US); Changhan Hobie Yun, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 14 days.

(21) Appl. No.: 14/991,803

(22) Filed: Jan. 8, 2016

(65) Prior Publication Data
US 2017/0200550 A1     Jul. 13, 2017

(51) Int. Cl.
*H01F 27/28* (2006.01)
*H01F 17/00* (2006.01)
(Continued)

(52) U.S. Cl.
CPC ..... *H01F 27/2804* (2013.01); *H01F 17/0013* (2013.01); *H01F 41/041* (2013.01);
(Continued)

(58) Field of Classification Search
CPC ......... H01F 2027/2809; H01F 17/0006; H01F 17/0013
See application file for complete search history.

(56) References Cited

U.S. PATENT DOCUMENTS

| 4,613,843 A | * | 9/1986 | Esper | H01F 27/2804 336/200 |
| 4,959,631 A | * | 9/1990 | Hasegawa | H01F 17/0006 336/180 |

(Continued)

FOREIGN PATENT DOCUMENTS

| CN | 102169868 A | * | 8/2011 | ............. H01F 17/00 |
| CN | 102169868 A | | 8/2011 | |

(Continued)

OTHER PUBLICATIONS

Cai J., et al., "A New Stratified Crossed Stacked Spiral Inductor with Improved Self-resonance Frequency," International Conference on Electronics, Communications and Control (ICECC), 2011, pp. 1240-1243.*

(Continued)

*Primary Examiner* — Mang Tin Bik Lian
*Assistant Examiner* — Malcolm Barnes
(74) *Attorney, Agent, or Firm* — Qualcomm Incorporated/Seyfarth Shaw LLP

(57) ABSTRACT

A skewed, co-spiral inductor structure may include a first trace arranged in a first spiral pattern that is supported by a substrate. The skewed, co-spiral inductor structure may also include a second trace arranged in a second spiral pattern, in which the second trace is coupled to the first trace. The first trace may overlap with the second trace in orthogonal overlap areas. In addition, each orthogonal overlap area may have a size defined by a width of the first trace and the width of the second trace. Also, parallel edges of the first trace and the second trace may be arranged to coincide.

25 Claims, 11 Drawing Sheets

(51) Int. Cl.
  *H01F 41/04* (2006.01)
  *H04B 1/40* (2015.01)
  *H01L 23/522* (2006.01)
  *H01L 27/02* (2006.01)
  *H01L 49/02* (2006.01)

(52) U.S. Cl.
  CPC ...... *H01L 23/5227* (2013.01); *H01L 27/0207* (2013.01); *H01L 28/10* (2013.01); *H04B 1/40* (2013.01); *H01L 23/5222* (2013.01)

(56) References Cited

U.S. PATENT DOCUMENTS

| | | | | |
|---|---|---|---|---|
| 5,420,558 | A * | 5/1995 | Ito | H01F 17/0006 336/200 |
| 5,831,331 | A * | 11/1998 | Lee | H01L 23/645 257/277 |
| 6,097,273 | A | 8/2000 | Frye et al. | |
| 6,175,293 | B1 * | 1/2001 | Hasegawa | H01F 1/15308 336/150 |
| 6,271,744 | B1 | 8/2001 | McCarthy | |
| 6,972,658 | B1 * | 12/2005 | Findley | H01F 17/0006 257/531 |
| 7,126,452 | B2 * | 10/2006 | Teshima | H01F 5/003 336/200 |
| 7,382,222 | B1 * | 6/2008 | Manetakis | H01F 17/0006 336/200 |
| 8,505,193 | B2 | 8/2013 | Papananos | |
| 9,035,423 | B1 * | 5/2015 | Tsukahara | H01F 27/2804 257/531 |
| 2004/0227608 | A1 * | 11/2004 | Nakatani | H01P 5/10 336/173 |
| 2006/0284719 | A1 * | 12/2006 | Lee | H01F 17/0013 336/223 |
| 2007/0247269 | A1 * | 10/2007 | Papananos | H01F 27/2804 336/200 |
| 2008/0303622 | A1 * | 12/2008 | Park | H01F 17/0013 336/200 |
| 2009/0085708 | A1 * | 4/2009 | Matsumoto | H01F 17/0013 336/200 |
| 2010/0109123 | A1 * | 5/2010 | Strzalkowski | H01F 17/0013 336/200 |
| 2011/0221560 | A1 * | 9/2011 | Chen | H01F 17/0013 336/200 |
| 2011/0248809 | A1 * | 10/2011 | Gertenbach | H01F 27/346 336/173 |
| 2012/0299151 | A1 * | 11/2012 | Frye | H01L 23/5223 257/531 |
| 2013/0069753 | A1 * | 3/2013 | Kurs | H01F 5/003 336/200 |
| 2014/0110821 | A1 * | 4/2014 | Barry | H01L 28/10 257/531 |
| 2015/0094008 | A1 * | 4/2015 | Maxim | H01F 17/0013 455/245.1 |
| 2015/0130579 | A1 * | 5/2015 | Kim | H01F 27/2804 336/200 |
| 2016/0027571 | A1 * | 1/2016 | Zhang | H01F 27/2804 336/173 |

FOREIGN PATENT DOCUMENTS

| | | | |
|---|---|---|---|
| KR | 20120000670 A * | 1/2012 | ............ H01F 17/00 |
| KR | 20120000670 A | 1/2012 | |

OTHER PUBLICATIONS

International Search Report and Written Opinion—PCT/US2016/058797—ISA/EPO—dated Apr. 21, 2017.

* cited by examiner

SKEWED CO-SPIRAL INDUCTOR STRUCTURE

BACKGROUND

Field

Aspects of the present disclosure relate to semiconductor devices, and more particularly to a skewed, co-spiral inductor structure for high quality (Q)-factor radio frequency (RF) applications.

Background

The process flow for semiconductor fabrication of integrated circuits (ICs) may include front-end-of-line (FEOL), middle-of-line (MOL), and back-end-of-line (BEOL) processes. The front-end-of-line process may include wafer preparation, isolation, well formation, gate patterning, spacer, extension and source/drain implantation, silicide formation, and dual stress liner formation. The middle-of-line process may include gate contact formation. Middle-of-line layers may include, but are not limited to, middle-of-line contacts, vias or other layers within close proximity to the semiconductor device transistors or other like active devices. The back-end-of-line process may include a series of wafer processing steps for interconnecting the semiconductor devices created during the front-end-of-line and middle-of-line processes.

Successful fabrication of modern semiconductor chip products involves interplay between the materials and the processes employed. In particular, the formation of conductive material plating for the semiconductor fabrication in the back-end-of-line processes is an increasingly challenging part of the process flow. This is particularly true in terms of maintaining a small feature size. The same challenge of maintaining a small feature size also applies to passive on glass (POG) technology, where high-performance components such as inductors and capacitors are built upon a highly insulative substrate that may also have a very low loss.

Passive on glass devices involve high-performance inductor and capacitor components that have a variety of advantages over other technologies, such as surface mount technology or multi-layer ceramic chips that are commonly used in the fabrication of mobile radio frequency (RF) chip designs (e.g., mobile RF transceivers). The design complexity of mobile RF transceivers is complicated by the migration to a deep sub-micron process node due to cost and power consumption considerations. Mobile RF transceiver design is further complicated by added circuit functions to support communication enhancements. Further design challenges for mobile RF transceivers include analog/RF performance considerations, including mismatch, noise and other performance considerations. The design of these mobile RF transceiver includes the use of passive devices to, for example, suppress resonance, and/or to perform filtering, bypassing and coupling in high power, system on chip devices, such as application processors and graphics processors.

SUMMARY

A skewed, co-spiral inductor structure may include a first trace arranged in a first spiral pattern that is supported by a substrate. The skewed, co-spiral inductor structure may also include a second trace arranged in a second spiral pattern, in which the second trace is coupled to the first trace. The first trace may overlap with the second trace in orthogonal overlap areas. In addition, each orthogonal overlap area may have a size defined by a width of the first trace and the width of the second trace. Also, parallel edges of the first trace and the second trace may be arranged to coincide.

A skewed, co-spiral inductor structure may include a first trace arranged in a first spiral pattern that is supported by a substrate. The skewed, co-spiral inductor structure may also include a second trace arranged in a second spiral pattern, in which the second trace is coupled to the first trace. The first trace may overlap with the second trace in orthogonal overlap areas. In addition, each orthogonal overlap area may have a size defined by a width of the first trace and the width of the second trace. Also, parallel edges of the first trace and the second trace may be are arranged to overlap up to 20%.

A method of fabricating skewed, co-spiral inductor structure may include fabricating a first trace directly on a surface of a substrate in a first spiral pattern. The method may also include depositing a separation material on the surface of the substrate and surrounding a portion(s) of the first trace as a separation layer. The method may further include fabricating a second trace on the separation layer in a second spiral pattern and coupled to the first trace through a via.

A skewed, co-spiral inductor structure may means for supporting. The skewed, co-spiral inductor structure may also include a first trace arranged in a first spiral pattern that on the supporting means. The skewed, co-spiral inductor structure may further include a second trace arranged in a second spiral pattern, in which the second trace is coupled to the first trace. The first trace may overlap with the second trace in orthogonal overlap areas. In addition, each orthogonal overlap area may have a size defined by a width of the first trace and the width of the second trace. Also, parallel edges of the first trace and the second trace may be arranged to coincide. The skewed, co-spiral inductor structure may also include means for electrically coupling the second trace to the first trace.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
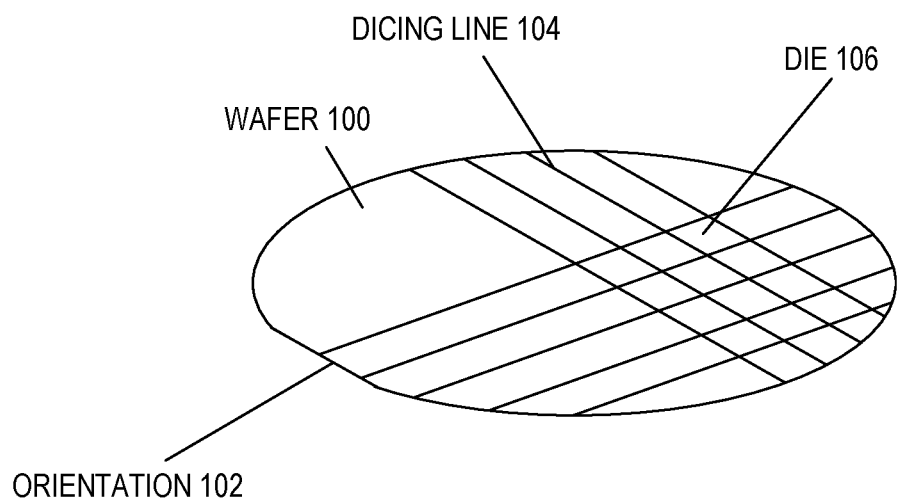
FIG. 1 illustrates a perspective view of a semiconductor wafer in an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR," and the use of the term "or" is intended to represent an "exclusive OR."

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as carrier aggregation. Further design challenges for mobile RF transceivers include analog/RF performance considerations, including mismatch, noise, and other performance considerations. The design of these mobile RF transceivers includes the use of passive devices, for example, to suppress resonance and/or to perform filtering, bypassing, and coupling.

Passive on glass devices involve high-performance inductor and capacitor components that have a variety of advantages over other technologies, such as surface mount technology or multi-layer ceramic chips. These advantages include being more compact in size and having smaller manufacturing variations. Passive on glass devices also involve a higher Q (or quality factor) value that meets stringent low insertion loss and low power consumption specifications. Devices such as inductors may be implemented as three-dimensional (3D) structures with passive on glass technologies. 3D inductors or other 3D devices may also experience a number of design constraints due to their 3D implementation.

An inductor is an example of an electrical device used to temporarily store energy in a magnetic field within a wire coil according to an inductance value. This inductance value provides a measure of the ratio of voltage to the rate of change of current passing through the inductor. When the current flowing through an inductor changes, energy is temporarily stored in a magnetic field in the coil. In addition to their magnetic field storing capability, inductors are often used in alternating current (AC) electronic equipment, such as radio equipment. For example, the design of mobile RF transceivers includes the use of inductors with improved inductance density while reducing magnetic loss at high frequency (e.g., 700 megahertz (MHz) to 5 gigahertz (GHz) RF range).

Various aspects of the disclosure provide techniques for fabrication of a skewed, co-spiral inductor structure. The process flow for semiconductor fabrication of the skewed, co-spiral inductor structure may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably unless such interchanging would tax credulity.

As described herein, the back-end-of-line interconnect layers may refer to the conductive interconnect layers (e.g., metal one (M1), metal two (M2), metal three (M3), etc.) for electrically coupling to front-end-of-line active devices of an integrated circuit. The back-end-of-line interconnect layers may electrically couple to middle-of-line interconnect layers for, for example, connecting M1 to an oxide diffusion (OD) layer of an integrated circuit. A back-end-of-line first via (V2) may connect M2 to M3 or others of the back-end-of-line interconnect layers.

Aspects of the present disclosure describe a skewed, co-spiral inductor structure for high quality (Q)-factor radio frequency (RF) applications. In one arrangement, the skewed, co-spiral inductor structure includes a first trace arranged in a first spiral pattern supported by a substrate. In addition, the inductor structure includes a second trace arranged in a second spiral pattern in which the second trace is coupled to the first trace. In this arrangement, the first trace overlaps with the second trace at orthogonal overlap areas. Each orthogonal overlap area has a size defined by a width of the first trace and a width of the second trace. In this arrangement, parallel edges of the first trace and second trace coincide. In an alternative arrangement, the parallel edges of the first trace and the second trace overlap, for example up to 20%.

In contrast to conventional inductors, which specify a co-spiral inductor with directly overlapping inductor traces, the improved inductor design is a skewed co-spiral inductor structure with reduced overlap between first and second traces of the co-spiral inductor structure. The inductor structure may be arranged directly on a substrate (e.g., glass with near zero loss). The first and second inductor traces can be coupled together with a through substrate via at a center of the inductor structure. The improved co-spiral inductor structure includes the first trace skewed over the second trace to significantly reduce capacitive coupling (e.g., 50%) between the traces. The improved co-spiral inductor structure also exhibits a substantial self-resonance frequency improvement (e.g., 60%) as well as an improved quality (Q)-factor at a high band (HB) frequency (e.g., 2.3 to 2.9 GHz RF range).

FIG. 1 illustrates a perspective view of a semiconductor wafer in an aspect of the present disclosure. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystalizes onto the seed crystal in the orientation of the crystal.

The wafer 100 may be a compound material, such as gallium arsenide (GaAs) or gallium nitride (GaN), a ternary material such as indium gallium arsenide (InGaAs), quaternary materials, glass, or any material that can be a substrate material. Although many of the materials may be crystalline in nature, polycrystalline or amorphous materials may also be used for the wafer 100. For example, various options for the substrate include a glass substrate, a semiconductor substrate, a core laminate substrate, a coreless substrate, a printed circuit board (PCB) substrate, or other like substrates.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form the die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

The noted wafer and die processing shown in FIG. 1 may be performed using a planar based process fabrication technology. While the die 106 continue to scale according to Moore's Law, unlike other analog and digital devices, inductors are generally not scalable. Scaling of conventional inductor structure includes using a solenoid type inductor that is arranged with the directly overlapping traces using a planar based process fabrication technology, for example, as shown in FIG. 2.

Figure 2:
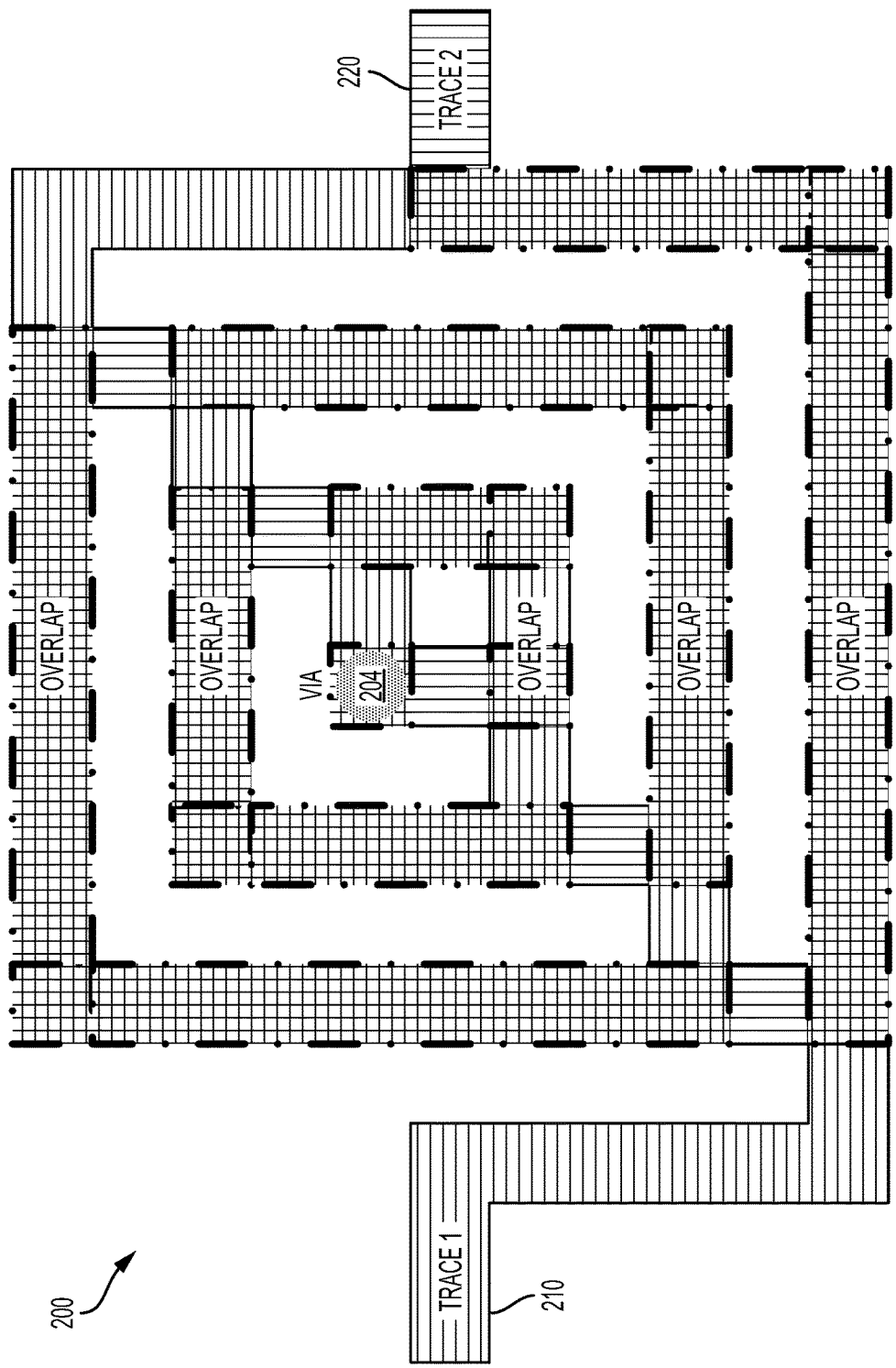
FIG. 2 illustrates an overhead view of a conventional inductor structure.

FIG. 2 illustrates a conventional inductor structure 200. Representatively, the conventional inductor structure 200 is composed of a first trace 210 and a second trace 220. The first trace 210 and the second trace 220 are arranged in directly overlapping spiral patterns coupled at a center of the conventional inductor structure 200 using a via 204. The conventional inductor structure 200 may be supported by a substrate (not shown). The conventional inductor structure 200 is arranged according to a multi-turn configuration.

Figure 3A:
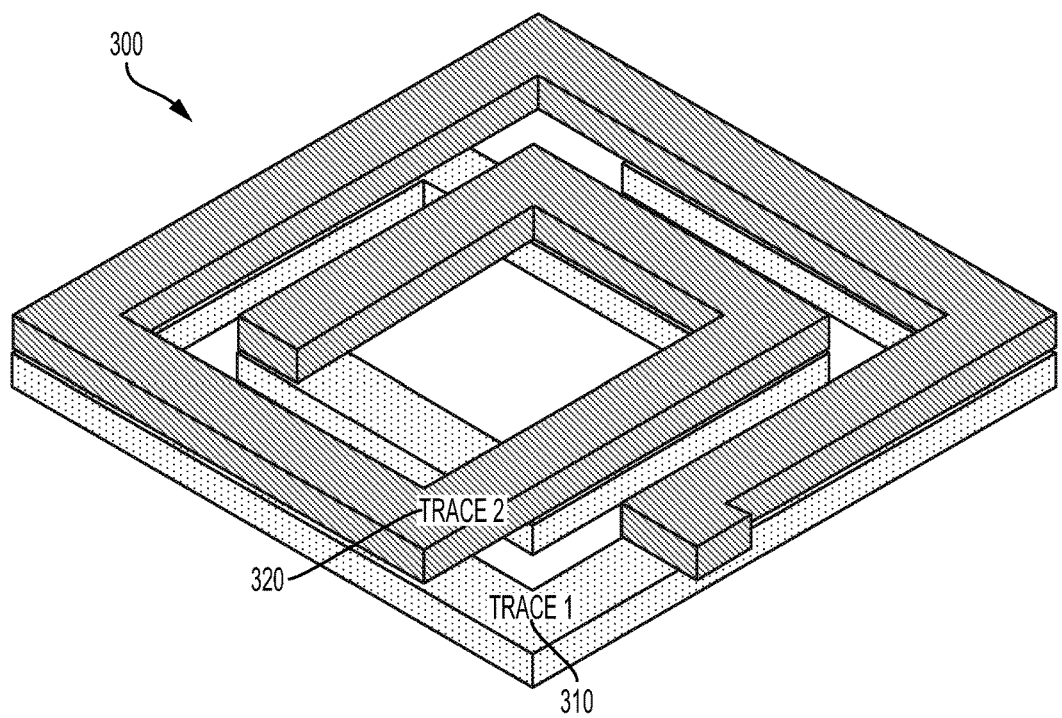
FIGS. 3A and 3B illustrate views of a conventional inductor structure.
Figure 3B:
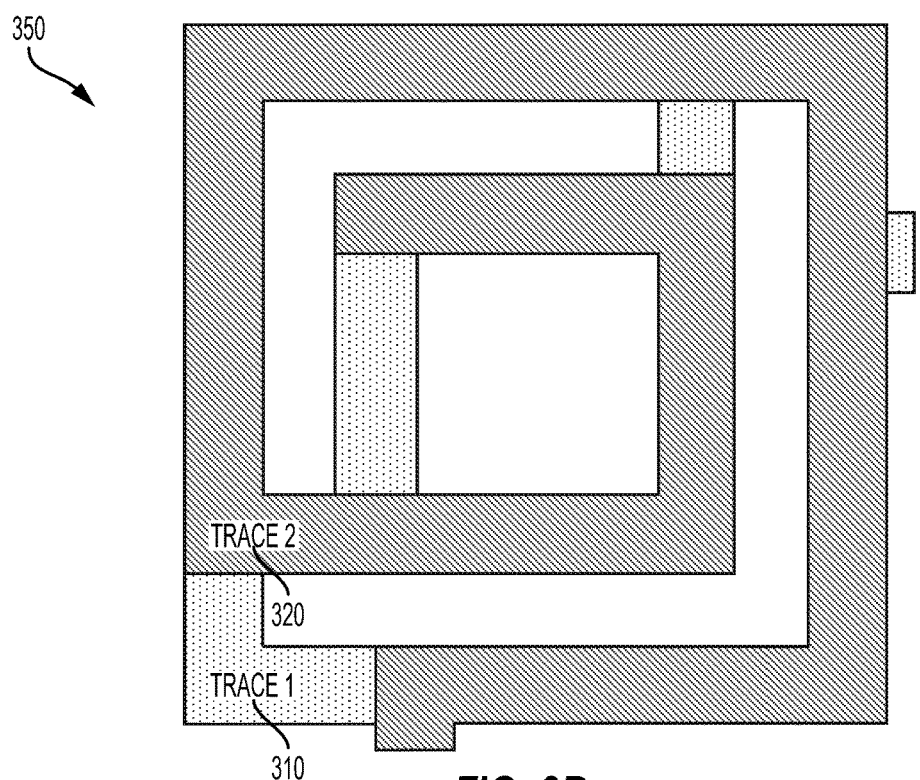

FIG. 3A shows a perspective of a conventional inductor structure 300 and FIG. 3B shows an overhead, 2D view 350 of the conventional inductor structure 300. Representatively, the conventional inductor structure 300 is composed of a first trace 310 and a second trace 220. The first trace 210 and the second trace 220 are arranged in directly overlapping spiral patterns coupled at a center of the conventional inductor structure 300 using a via 304. The conventional inductor structure 200 may be supported by a substrate (not shown). The conventional inductor structure 300, although similar to the conventional inductor structure 200 of FIG. 2, is arranged according to a reduced turn configuration.

As noted above, the design of future mobile RF transceivers involves the use of RF high-density inductors with reduced parasitic capacitance for improved self-resonance and a quality (Q)-factor at high band (HB), for example, above the 1.7 gigahertz (GHz) RF range. Unfortunately, unlike other analog devices, inductors are generally not scalable. For example, the conventional inductor structure 300 is similar to a solenoid type of inductor that is arranged with the directly overlapping traces using a planar based process fabrication technology. As a result, the area of the conventional inductor structure 300 is reduced by directly overlapping the first trace 310 and the second trace 320 to reduce the total area and enabling scaling with semiconductor devices.

Furthermore, directly overlapping traces result in significant capacitive coupling and/or capacitive loading between the first trace 310 and the second trace 320. This parasitic capacitance reduces the self-resonance frequency at which the conventional inductor structure 300 transitions into operating as a capacitor. The parasitic capacitance, due to the directly overlapping traces, also reduces the Q-factor of the conventional inductor structure 300 at high frequencies. The self-resonance and the inductance density of the conventional inductor structure 300 may be improved by reducing the overlap between the first trace 310 and the second trace 320, for example, as shown in FIGS. 4A to 4C and FIG. 6.

Figure 4A:
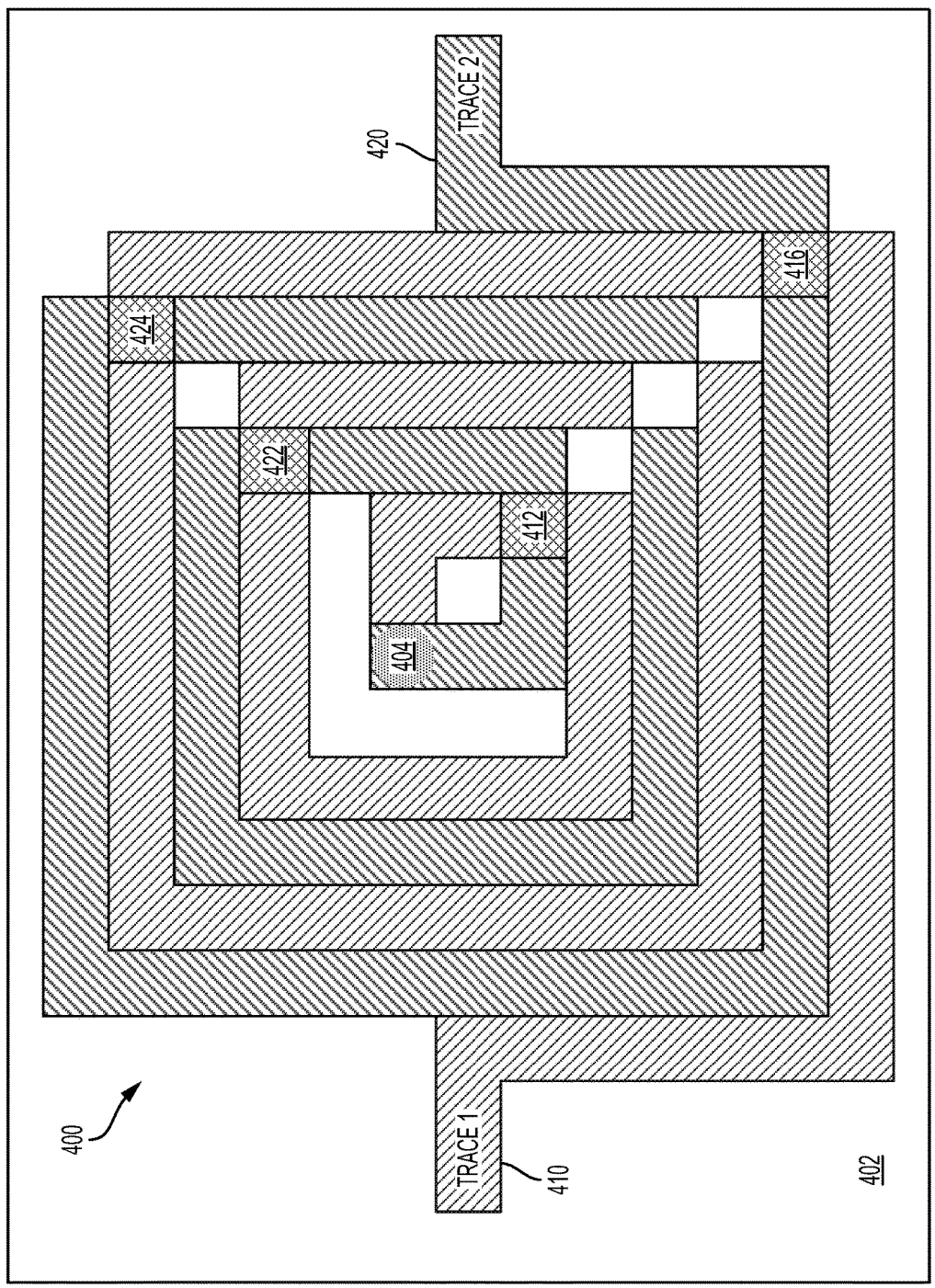
FIGS. 4A to 4C illustrate views of a skewed, co-spiral inductor structure according to aspects of the present disclosure.
Figure 4B:
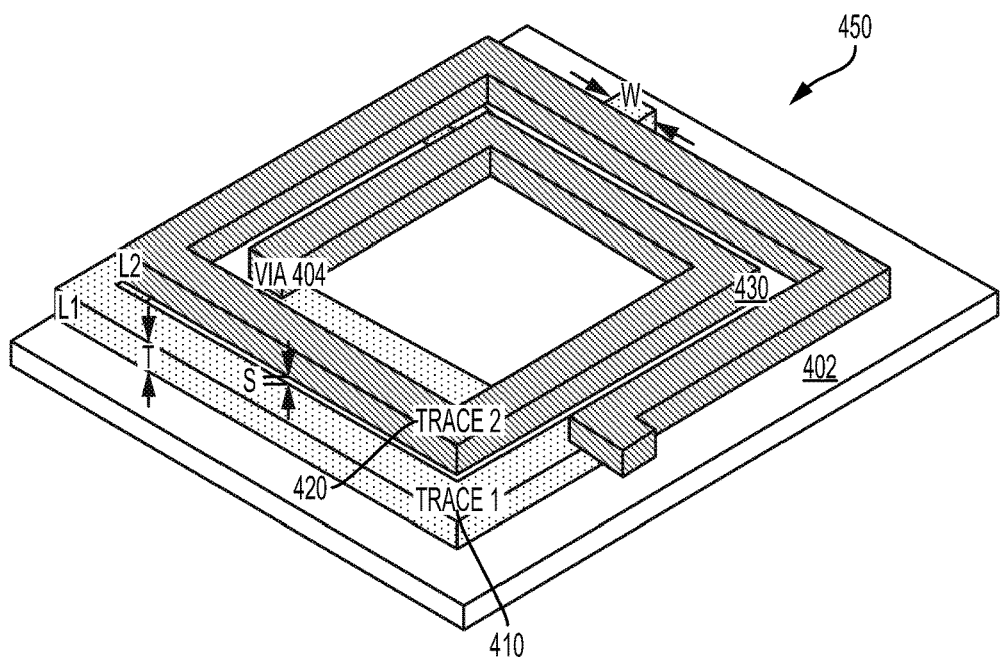
Figure 4C:
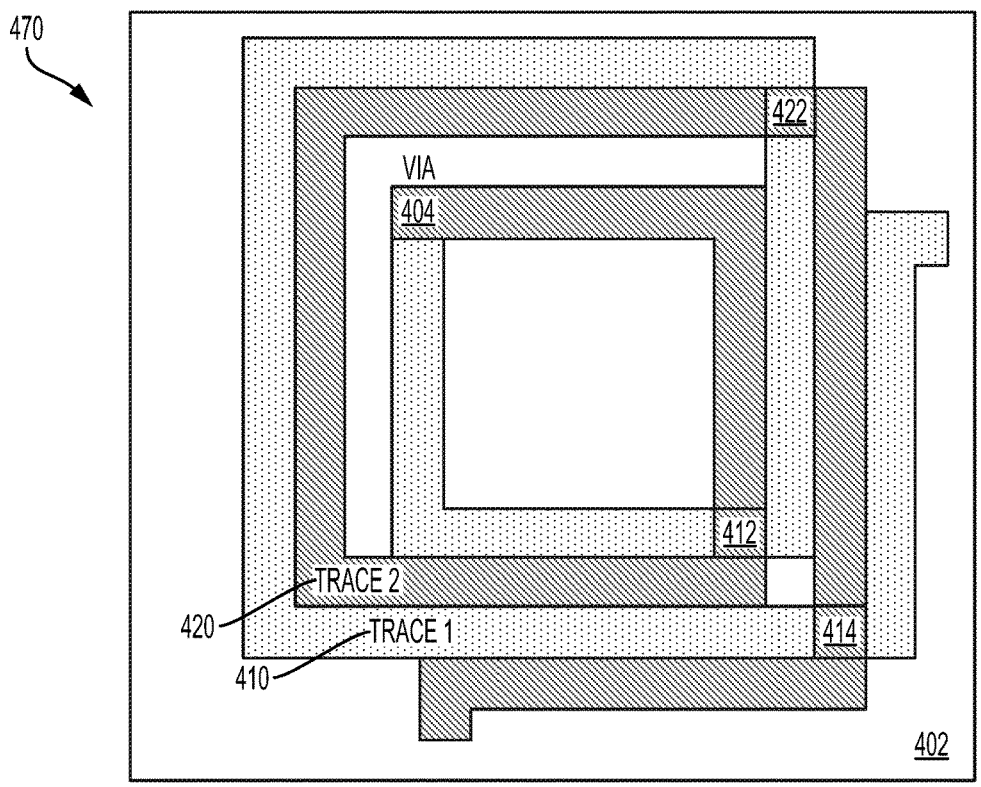

FIGS. 4A to 4C illustrate views of a skewed, co-spiral inductor structure, according to aspects of the present disclosure. In contrast to conventional inductor structures shown in FIGS. 2, 3A and 3B, which specify a co-spiral inductor with directly overlapping inductor traces, FIG. 4A illustrates an overhead view of a skewed co-spiral inductor structure 400, according to aspects of the present disclosure. An improved inductor design reduces an overlap between a first trace 410 and a second trace 420 of the skewed co-spiral inductor structure 400. The skewed co-spiral inductor structure 400 is arranged directly on a substrate 402 (e.g., glass with near zero loss) and the first trace 410 and the second trace 420 are coupled together with a through substrate via 404 at a center of the skewed co-spiral inductor structure 400.

In this aspect of the present disclosure, the skewed co-spiral inductor structure 400 includes the first trace 410 skewed over the second trace 420 to significantly reduce capacitive coupling (e.g., 50%) between the traces. The skewed co-spiral inductor structure 400 also exhibits a substantial self-resonance frequency improvement (e.g., 60%) as well as an improved quality (Q)-factor at a high band (HB) frequency (e.g., 2.3 to 2.9 GHz RF range) due to the reduced parasitic coupling achieved by skewing the first trace 410 and the second trace 420.

Representatively, the skewed co-spiral inductor structure 400 includes a substrate 402 that may be composed of a glass substrate, such as a solid glass substrate, a semiconductor substrate, a core laminate substrate, a coreless substrate, or a printed circuit board (PCB) substrate. The skewed co-spiral inductor structure 400 also includes a first trace 410 (Trace 1) and a second trace 420 (Trace 2) supported by the substrate 402 and electrically coupled together through a via 404 at a center portion of the skewed co-spiral inductor structure 400. In this configuration, the first trace 410 is arranged in a first spiral pattern, and the second trace 420 is arranged in a second spiral pattern.

In this aspect of the present disclosure, the first trace 410 overlaps with the second trace 420 at orthogonal overlap areas (e.g., 412, 414, 416, 422, and 424). Each of the orthogonal overlap areas (e.g., 412, 414, 416, 422, and 424) may have a size defined by a width of the first trace 410 and a width of the second trace 420. In this arrangement, a total area of the orthogonal overlap areas (e.g., 412, 414, 416, 422, and 424) is less than 10 percent of a first trace length and/or a second trace length. In addition, parallel edges of the first trace 410 and the second trace 420 coincide to eliminate any overlap between the parallel edges of the first trace 410 and the second trace 420, which reduces capacitive coupling between the traces.

FIGS. 4B and 4C show a 3D view 450 and a 2D view 470 of the skewed co-spiral inductor structure 400 in a 1.5 turn configuration according to aspects of the present disclosure. In this arrangement, the first trace 410 is fabricated directly on a surface of the substrate 402 and electrically coupled to the via 404 at a first level (L1). The first trace 410 may be surrounded by a separation material, such as a polyimide or other like separation or dielectric material to provide a separation layer 430. In addition, the second trace 420 is fabricated on separation layer 430 at a second level (L2) above the substrate 402 according to a spacing (S). In this arrangement, the second trace 420 is electrically coupled to the first trace 410 through the via 404 at a center portion of the skewed co-spiral inductor structure 400.

As shown in FIGS. 4B and 4C, the first trace 410, is arranged according to in a first spiral pattern to provide a first spiral inductor, and the second trace 420 is arranged according to in a second spiral pattern to provide a second spiral inductor arranged in a direction opposite and offset from the first spiral inductor. In this arrangement, a thickness (T) of the first trace 410 is within a range of ten (10) to twenty (20) micrometers, and a width of the first trace 410 is within a range of twenty (20) to one hundred (100) micrometers. The second trace 420 may be configured according to a similar configuration. In addition, a spacing (S) between the second trace 420 and the first trace 410 may be within the range of three (3) to ten (10) micrometers. Alternatively, the first trace 410 and the second trace 420 may be arranged according to varying widths (W), spacings (S), and thicknesses (W) depending a desired self-resonance frequency, capacitive coupling level, inductor density or other like performance metric. In this arrangement, a total number of turns of the first trace 410 is at least 1.5 turns.

Figure 5A:
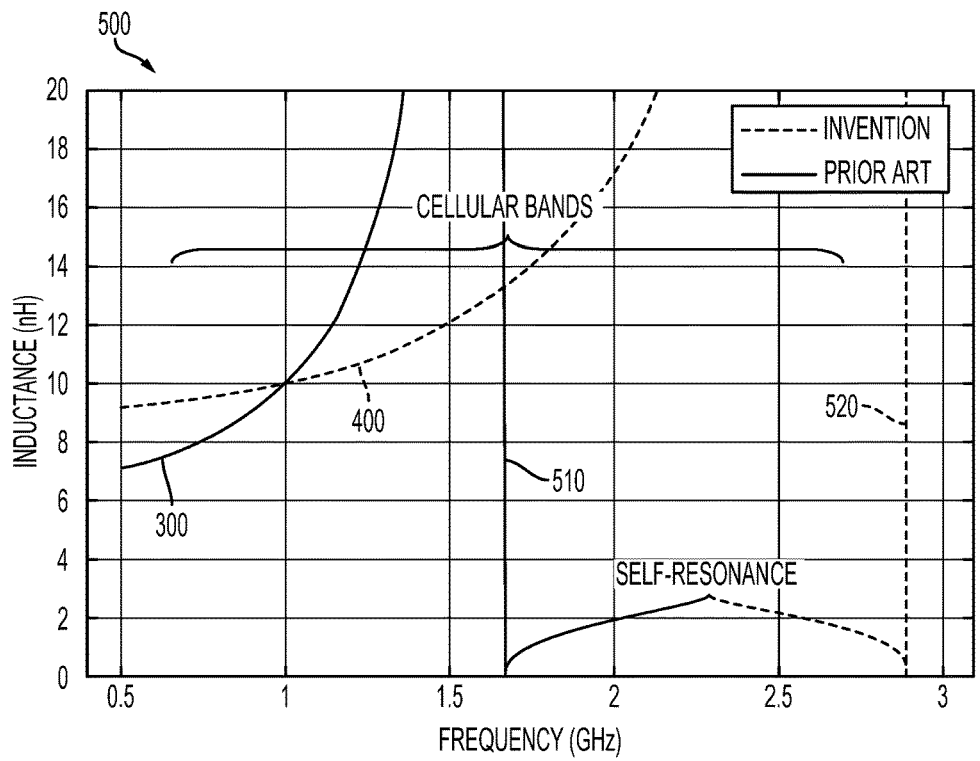
FIGS. 5A and 5B show graphs comparing the performance of the skewed, co-spiral inductor structure of FIGS. 4A to 4C versus the conventional inductor structure shown in FIGS. 2, 3A and 3B according to aspects of the present disclosure.
Figure 5B:
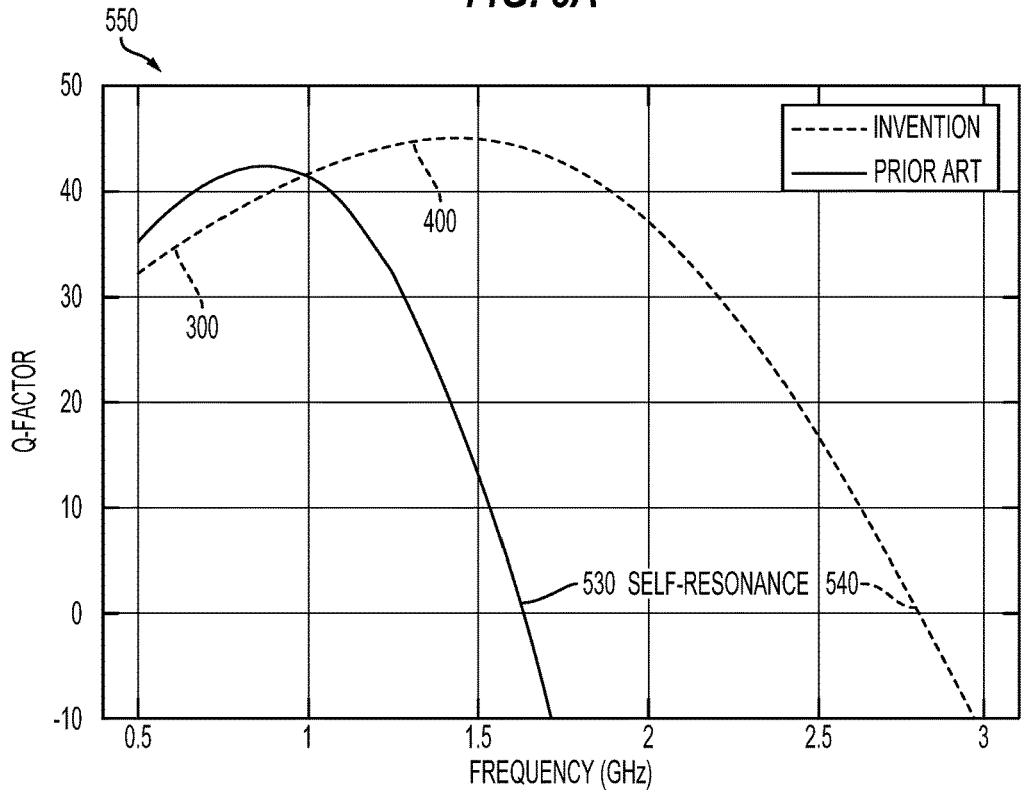

FIGS. 5A and 5B show graphs comparing the performance of the skewed, co-spiral inductor structure of FIGS. 4A to 4C to the conventional inductor structure shown in FIGS. 2, 3A and 3B, according to aspects of the present disclosure. FIG. 5A shows a graph 500 of the inductance of the conventional inductor structure 300 at various frequencies (e.g., 0.5 GHz to 3 GHz) in relation to the inductance of the skewed co-spiral inductor structure 400 at the various frequencies. As shown in FIG. 5A, the inductance of the conventional inductor structure 300 and the inductance of the skewed co-spiral inductor structure 400 are similar within the 0.5 GHz to the 1 GHz range. Beyond the 1 GHz range however, the inductance of the conventional inductor structure 300 spikes, resulting in a self-resonance frequency 510 of 1.7 GHz. By contract, the inductance of the skewed co-spiral inductor structure 400 gradually increases beyond the 1 GHz range, resulting in a self-resonance frequency 520 of 2.7 GHz.

FIG. 5B shows a graph 550 of a Q-factor 530 of the conventional inductor structure 300 at various frequencies (e.g., 0.5 GHz to 3 GHz) in relation to the Q-factor 540 of the skewed co-spiral inductor structure 400 at the various frequencies. As shown in FIG. 5B, the Q-factor 530 of the conventional inductor structure 300 and the Q-factor 540 of the skewed co-spiral inductor structure 400 are similar within the 0.5 GHz to the 1 GHz range. Beyond the 1 GHz range however, the Q-factor 530 of the conventional inductor structure 300 plummets, resulting in the self-resonance frequency 510 of 1.7 GHz. By contract, the Q-factor 540 of the skewed co-spiral inductor structure 400 gradually decreases beyond the 1 GHz range, resulting in the self-resonance frequency 520 of 2.7 GHz. As shown in FIGS. 5A and 5B, the conventional inductor structure 300 becomes a capacitor at 1.7 GHz, while the skewed co-spiral inductor structure 400 resonates at 2.9 GHz. The skewed co-spiral inductor structure 400, therefore, extends an inductive function to a full cellular frequency and offers an improved Q-factor at a high-band of 2.7 GHz. In this arrangement, the skewed co-spiral inductor structure 400 is configured to self-resonate at a frequency greater than an RF band. For example, the frequency is greater than a 2.4 GHz RF band.

Figure 6:
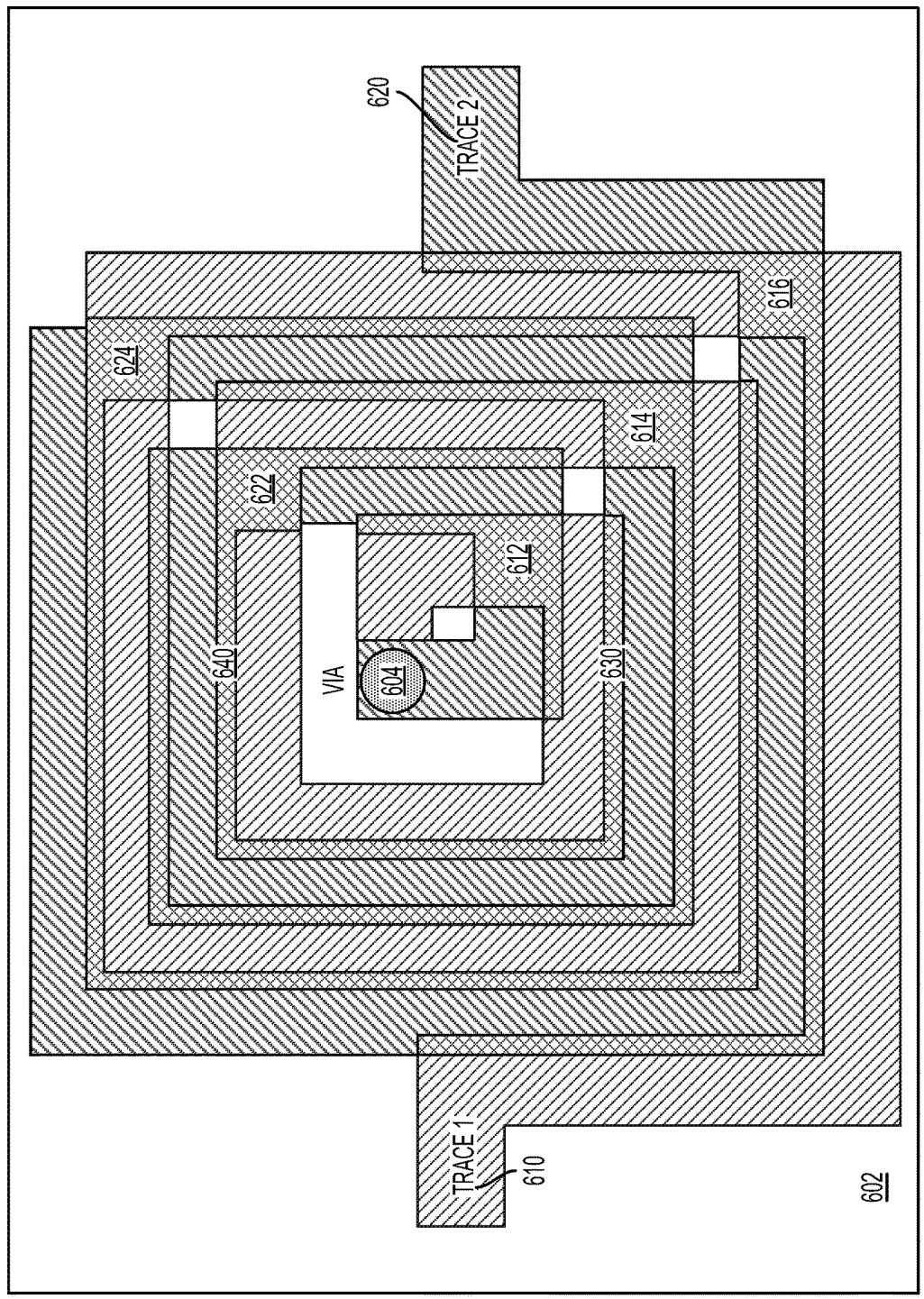
FIG. 6 illustrates an overhead view of a skewed co-spiral inductor structure having partially overlapping parallel edges according to aspects of the present disclosure.

FIG. 6 illustrates an overhead view of a skewed co-spiral inductor structure 600 having partially overlapping parallel edges according to aspects of the present disclosure. An improved inductor design includes a partial overlap between parallel edges of a first trace 610 and a second trace 620 of the skewed co-spiral inductor structure 600. The skewed co-spiral inductor structure 600 is arranged directly on a substrate 602 (e.g., glass with near zero loss). In this arrangement, the first trace 610 and the second trace 620 are coupled together with a through substrate via 604 at a center of the skewed co-spiral inductor structure 600. The first trace 610 and/or the second trace 620 may be composed of a material selected from a group consisting of copper, aluminum, nickel, silver, silver paste, or copper paste, or other like high resistivity material.

Representatively, the skewed co-spiral inductor structure 600 includes a substrate 602 that may be composed of a glass substrate, such as a solid glass substrate, a semiconductor substrate, a core laminate substrate, a coreless substrate, or a printed circuit board (PCB) substrate. The skewed co-spiral inductor structure 600 also includes a first trace 610 (Trace 1) and a second trace 620 (Trace 2) supported by the substrate 602 and electrically coupled together through the via 604 at a center portion of the skewed co-spiral inductor structure 600. In this configuration, the first trace 610 is arranged in a first spiral pattern, and the second trace 620 is arranged in a second spiral pattern.

In this aspect of the present disclosure, similar to the configuration shown in FIGS. 4A to 4C, the first trace 610 overlaps with the second trace 620 at orthogonal overlap areas (e.g., 612, 614, 616, 622, and 624). In addition, each of the orthogonal overlap areas (e.g., 612, 614, 616, 622, and 624) may have a size defined by a width of the first trace 610 and the width of the second trace 620. In this arrangement, however, a width of the first trace 610 and the second trace 620 is expanded so that parallel edges of the first trace 610 and the second trace 620 partially overlap. The expanded width of the first trace 610 and the second trace 620 provides additional overlap areas (e.g., 630 and 640) at the parallel edges of the first trace 610 and the second trace 620. Although some capacitive coupling between the traces may result from the partial overlap, the widths, thickness and materials of the first trace 610 and the second trace 620 may be adjusted to compensate for any parasitic coupling. That is, the overlapped traces reduce a size of the skewed co-spiral inductor structure while maintaining performance.

Figure 7A:
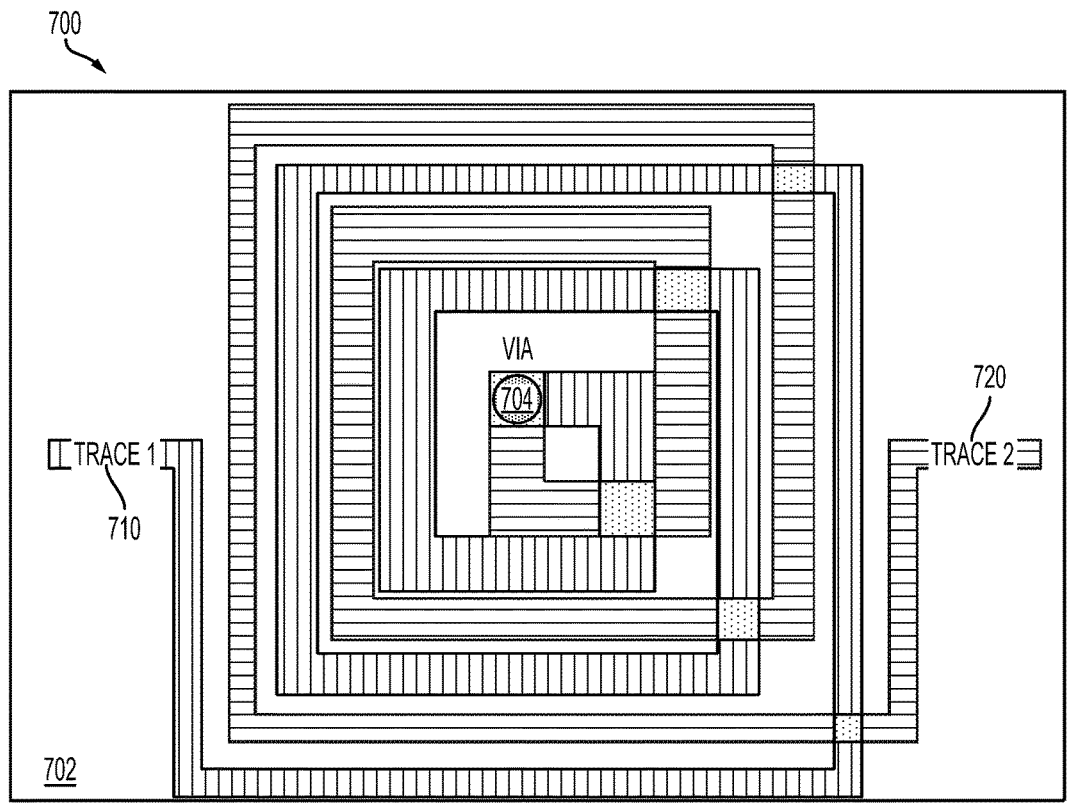
FIGS. 7A and 7B illustrate overhead views of skewed co-spiral inductor structure having varying trace widths according to aspects of the present disclosure according to an aspect of the present disclosure.
Figure 7B:
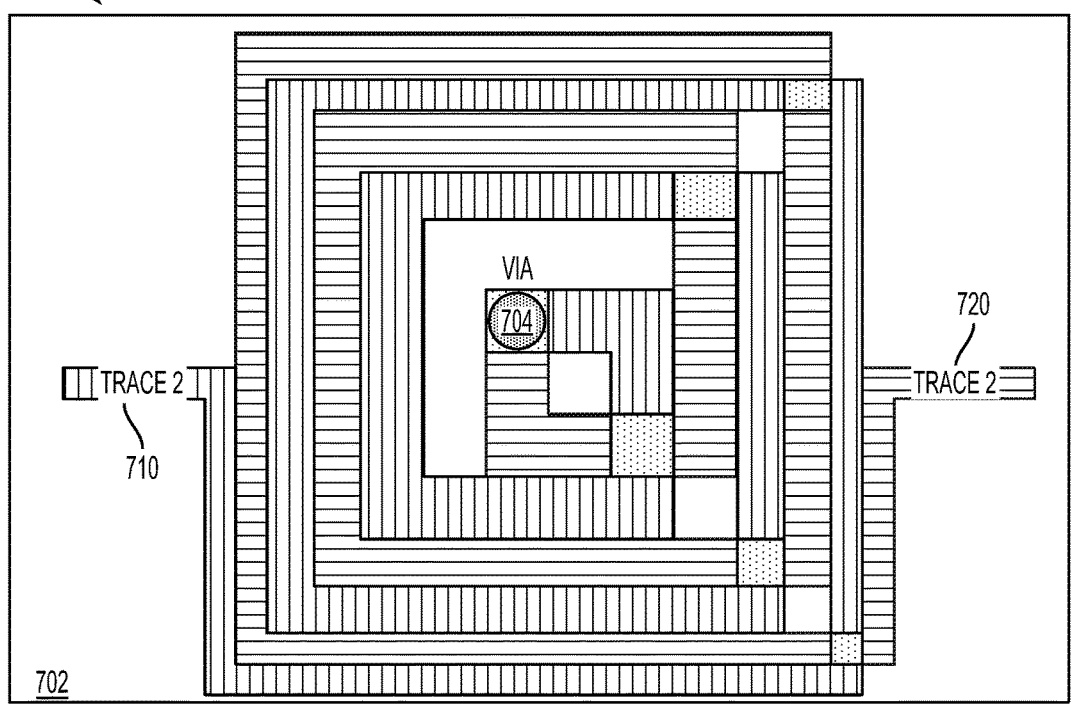

FIGS. 7A and 7B illustrate overhead views of skewed co-spiral inductor structure having varying trace widths according to aspects of the present disclosure according to an aspect of the present disclosure. FIG. 7A illustrates a skewed co-spiral inductor structure 700 having a reduced footprint according to aspects of the present disclosure. The improved inductor design includes varying widths along a first trace 710 and a second trace 720 of the skewed co-spiral inductor structure 700. The skewed co-spiral inductor structure 700 is arranged directly on a substrate 702 (e.g., glass with near zero loss). The first trace 710 and the second trace 720 are coupled together with a through substrate via 704 at a center of the skewed co-spiral inductor structure 700. In this arrangement, traces widths are varies so that parallel edges of the first trace 710 and the second trace 720 do not coincide to further eliminate any overlap between the parallel edges of the first trace 710 and the second trace 720, which further reduces capacitive coupling between the traces, while possibly occupying a larger footprint.

FIG. 7B illustrates a skewed co-spiral inductor structure 750 also having a reduced footprint according to aspects of the present disclosure. The improved inductor design also includes varying widths along the first trace 710 and the second trace 720 of the skewed co-spiral inductor structure 750. The skewed co-spiral inductor structure 700 is also arranged directly on the substrate 702. In this arrangement, the first trace 710 and the second trace 720 are also coupled together with a through substrate via 704 at a center of the skewed co-spiral inductor structure 750. In this arrangement, although the trace widths are varied, parallel edges of the first trace 710 and the second trace 720 coincide to eliminate any overlap between the parallel edges of the first trace 710 and the second trace 720, which reduces capacitive coupling between the traces.

The first trace 710 and/or the second trace 720 may be composed of a material selected from a group consisting of copper, aluminum, nickel, silver, silver paste, or copper paste, or other like high resistivity material. In the arrangements shown in FIGS. 7A and 7B, the varying trace widths along the first trace 710 and the second trace 720 may be selected to control trace coupling as well as the area of the inductor structures. In addition, the trace widths are varied to eliminate any overlap between the parallel edges of the first trace 710 and the second trace 720, which further reduces capacitive coupling between the traces.

Figure 8:
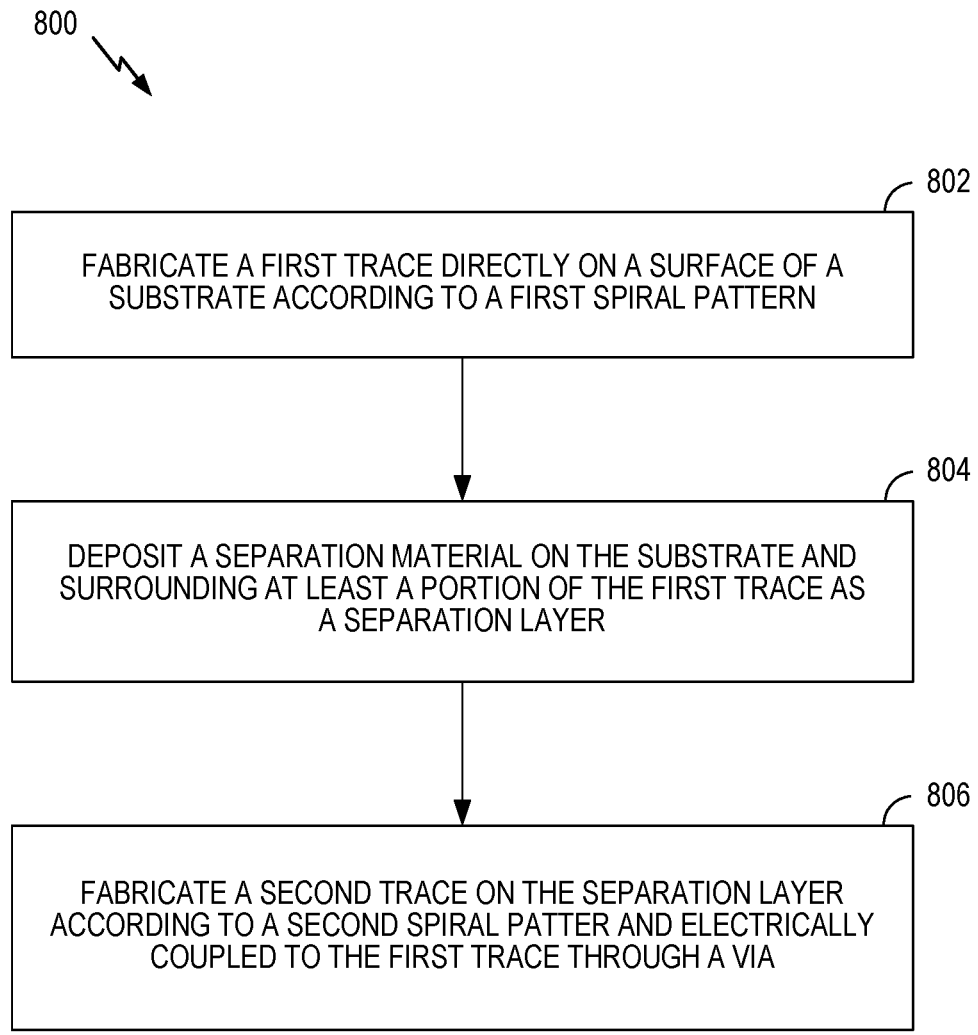
FIG. 8 is a process flow diagram illustrating a method of fabricating skewed, co-spiral inductor structure according to an aspect of the present disclosure.

FIG. 8 is a flow diagram illustrating a method 800 of fabricating a skewed, co-spiral inductor structure according to aspects of the disclosure. At block 802, a first trace is fabricated directly on a surface of a substrate in a first spiral pattern. For example, as shown in FIG. 4B, the first trace 410 is fabricated on a surface of the substrate 402. At block 804, a separation material is deposited on the surface of the substrate and surrounding at least a portion of the first trace to provide a separation layer. For example, as shown in FIG. 4B, the separation layer 430 is disposed on the surface of the substrate 402 and surrounding the first trace 410. At block 806, a second trace is fabricated on the separation layer in a second spiral pattern and electrically coupled to the first trace through a via. For example, as shown in FIG. 4B, the second trace 420 is fabricated on the separation layer 430 in the second spiral pattern and coupled to the first trace 410 through the via 404.

In one configuration, a skewed, co-spiral inductor structure is described. The skewed, co-spiral inductor structure includes a means for supporting. The co-spiral inductor further includes means for electrically coupling the second trace to the first trace. In one aspect of the disclosure, the supporting means is the substrate 402/602 of FIGS. 4A to 4C and 6, configured to perform the functions recited by the supporting means. In this aspect of the disclosure, the electrical coupling means is the via 404/604 of FIGS. 4A to 4C and 6, configured to perform the functions recited by the electrical coupling means. In another aspect, the aforementioned means may be a device or any layer configured to perform the functions recited by the aforementioned means.

As noted above, the design of future mobile RF transceivers involves the use of RF high-density inductors with reduced parasitic capacitance for improved self-resonance and a quality (Q)-factor at high band (HB), for example, above the 1.7 gigahertz (GHz) RF range. Unfortunately, unlike other analog devices, inductors are generally not scalable. For example, the conventional inductor structure 300 is similar to a solenoid type of inductor that is arranged with the directly overlapping traces using a planar based process fabrication technology. As a result, the area of the conventional inductor structure 300 is reduced by directly overlapping the first trace 310 and the second trace 320 to reduce the total area and enabling scaling with semiconductor devices.

Furthermore, directly overlapping traces in conventional spiral inductors result in significant capacitive coupling and/or capacitive loading between the inductor traces. This parasitic capacitance reduces the self-resonance frequency at which the conventional inductor structure transitions into operating as a capacitor. The parasitic capacitance, due to the directly overlapping traces, also reduces the Q-factor of the conventional inductor structure at high frequencies. The self-resonance and the inductance density of the conventional inductor structure may be improved reducing the overlap between the inductor traces.

Aspects of the present disclosure describe a skewed, co-spiral inductor structure for high quality (Q)-factor radio frequency (RF) applications. In one arrangement, the skewed, co-spiral inductor structure includes a first trace arranged in a first spiral pattern supported by a substrate. In addition, the inductor structure includes a second trace arranged in a second spiral pattern in which the second trace is coupled to the first trace. In this arrangement, the first trace overlaps with the second trace at orthogonal overlap areas. Each orthogonal overlap area has a size defined by a width of the first trace and a width of the second trace. In this arrangement, parallel edges of the first trace and second trace coincide. In an alternative arrangement, the parallel edges of the first trace and the second trace overlap up to 20%.

In contrast to conventional inductors, which specify a co-spiral inductor with directly overlapping inductor traces, the improved inductor design is a skewed co-spiral inductor structure with reduced overlap between first and second traces of the co-spiral inductor structure. The inductor structure may be arranged directly on a substrate (e.g., glass with near zero loss) and the first and second inductor traces coupled together with a through substrate via at a center of the inductor structure. The improved co-spiral inductor structure includes the first trace skewed over the second trace to significantly reduce capacitive coupling (e.g., 50%) between the traces. The improved co-spiral inductor structure also exhibits a substantial self-resonance frequency improvement (e.g., 60%) as well as an improved quality (Q)-factor at a high band (HB) frequency (e.g., 2.3 to 2.9 GHz RF range).

Figure 9:
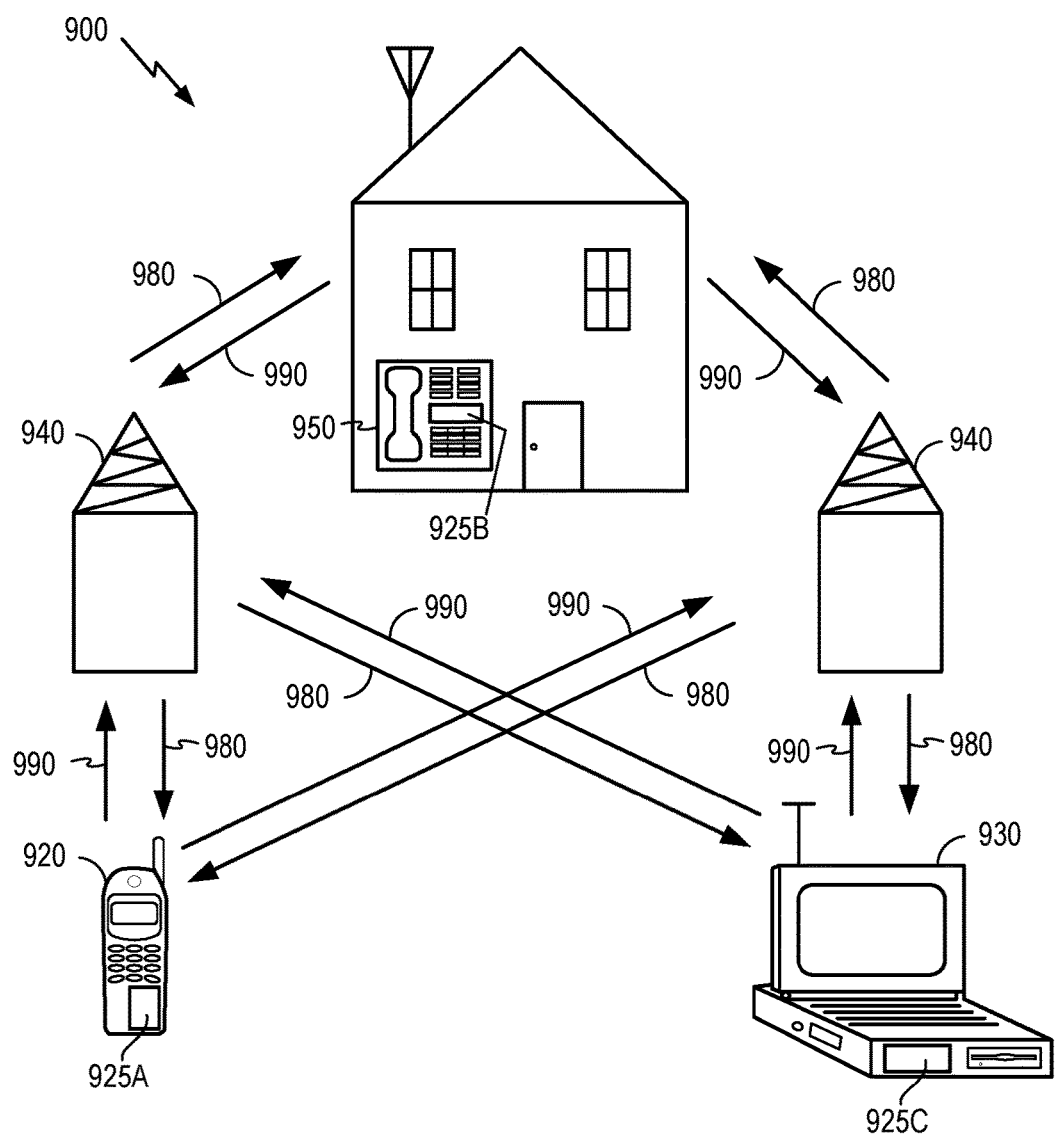
FIG. 9 is a block diagram showing an exemplary wireless communication system in which a configuration of the disclosure may be advantageously employed.

FIG. 9 is a block diagram showing an exemplary wireless communication system 900 in which an aspect of the disclosure may be advantageously employed. For purposes of illustration, FIG. 9 shows three remote units 920, 930, and 950 and two base stations 940. It will be recognized that wireless communication systems may have many more remote units and base stations. Remote units 920, 930, and 950 each include IC devices 925A, 925C, and 925B having a radio frequency (RF) front end module that includes the disclosed inductors. It will be recognized that other devices may also include the disclosed inductors, such as the base stations, switching devices, and network equipment including a RF front end module. FIG. 9 shows forward link signals 980 from the base station 940 to the remote units 920, 930, and 950 and reverse link signals 990 from the remote units 920, 930, and 950 to base stations 940.

In FIG. 9, remote unit 920 is shown as a mobile telephone, remote unit 930 is shown as a portable computer, and remote unit 950 is shown as a fixed location remote unit in a wireless local loop system. For example, the remote units 920, 930, and 950 may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or a communications device, including an RF front end module, that stores or retrieves data or computer instructions, or combinations thereof. Although FIG. 9 illustrates remote units according to the aspects of the disclosure, the disclosure is not limited to these exemplary illustrated units. Aspects of the disclosure may be suitably employed in many devices, which include the disclosed devices.

Figure 10:
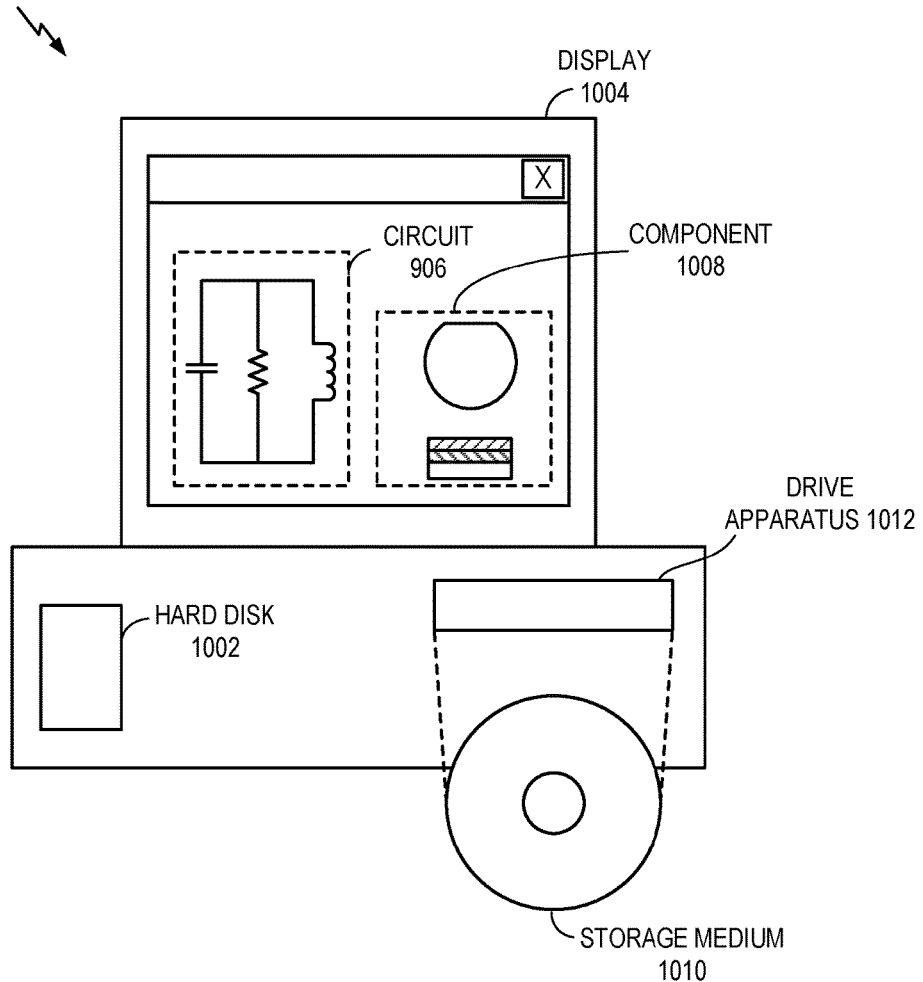
FIG. 10 is a block diagram illustrating a design workstation used for circuit, layout, and logic design of a semiconductor component according to one configuration.

FIG. 10 is a block diagram illustrating a design workstation used for circuit, layout, and logic design of a semiconductor component, such as the inductors disclosed above. A design workstation 1000 includes a hard disk 1002 containing operating system software, support files, and design software such as Cadence or OrCAD. The design workstation 1000 also includes a display 1004 to facilitate design of a circuit 1006 or a semiconductor component 1008 such as an inductor. A storage medium 1010 is provided for tangibly storing the design of the circuit 1006 or the semiconductor component 1008. The design of the circuit 1006 or the semiconductor component 1008 may be stored on the storage medium 1010 in a file format such as GDSII or GERBER. The storage medium 1010 may be a CD-ROM, DVD, hard disk, flash memory, or other appropriate device. Furthermore, the design workstation 1000 includes a drive apparatus 1012 for accepting input from or writing output to the storage medium 1010.

Data recorded on the storage medium 1010 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1010 facilitates the design of the circuit 1006 or the semiconductor component 1008 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A skewed, co-spiral inductor structure, comprising:
   a first trace arranged in a first spiral pattern supported by a substrate; and
   a second trace arranged in a second spiral pattern, the second trace having a same width as the first trace and coupled to the first trace, the first trace overlapping with the second trace in a plurality of orthogonal overlap areas, each orthogonal overlap area having a size defined by the width of the first trace and the width of the second trace, each orthogonal overlap area orthogonal to an adjacent portion of the first trace and an adjacent portion of the second trace, in which each straight, parallel edge of the first trace and the second trace partially overlaps by a predetermined amount in a reduced footprint of the co-spiral inductor structure.

2. The co-spiral inductor structure of claim 1, in which a total of the plurality of orthogonal overlap areas is less than 10 percent of a first trace area and/or a second trace area.

3. The co-spiral inductor structure of claim 1, in which the first trace comprises a first spiral inductor and the second trace comprises a second spiral inductor arranged in a direction opposite and offset from the first spiral inductor.

4. The co-spiral inductor structure of claim 1, further comprising a via coupling the first trace to the second trace at a center portion of the co-spiral inductor structure.

5. The co-spiral inductor structure of claim 1, in which the second trace extends from a center portion of the co-spiral inductor structure according to the second spiral pattern in an opposite direction and offset from the first spiral pattern to reduce the plurality of overlap areas.

6. The co-spiral inductor structure of claim 1, in which the co-spiral inductor structure self-resonates at a frequency greater than an RF band.

7. The co-spiral inductor structure of claim 6, in which the frequency is greater than 2.4 GHz.

8. The co-spiral inductor structure of claim 1, in which the substrate comprises a glass substrate or a coreless substrate.

9. The co-spiral inductor structure of claim 1, in which a thickness of the first trace is within a range of ten (10) to twenty (20) micrometers.

10. The co-spiral inductor structure of claim 1, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

11. A skewed, co-spiral inductor structure, comprising:
a first trace arranged in a first spiral pattern supported by a substrate; and
a second trace arranged in a second spiral pattern, the second trace having a same width as the first trace and coupled to the first trace, the first trace overlapping with the second trace in a plurality of orthogonal overlap areas, each of the plurality of orthogonal overlap areas having a size defined by the width of the first trace and the width of the second trace, each orthogonal overlap area orthogonal to an adjacent portion of the first trace and an adjacent portion of the second trace, in which each straight, parallel edge of the first trace and the second trace partially overlaps by a predetermined amount up to 20% in a reduced footprint of the skewed, co-spiral inductor structure.

12. The co-spiral inductor structure of claim 11, in which a thickness of the first trace is within a range of ten (10) to twenty (20) micrometers.

13. The co-spiral inductor structure of claim 11, in which the width of the first trace and the width of the second trace is within a range of twenty (20) to one hundred (100) micrometers.

14. The co-spiral inductor structure of claim 11, in which a spacing between the second trace and the first trace is within a range of three (3) to ten (10) micrometers.

15. The co-spiral inductor structure of claim 11, in which the first trace comprises a first spiral inductor and the second trace comprises a second spiral inductor arranged in a direction opposite and offset from the first spiral inductor.

16. The co-spiral inductor structure of claim 11, in which a total number of turns of the first trace is at least 1.5 turns.

17. The co-spiral inductor structure of claim 11, in which the first trace is comprised of a material selected from a group consisting of copper, aluminum, nickel, silver, silver paste, or copper paste.

18. The co-spiral inductor structure of claim 11, in which the substrate comprises a glass substrate, a semiconductor substrate, a core laminate substrate, a coreless substrate or a printed circuit board (PCB) substrate.

19. The co-spiral inductor structure of claim 11, integrated into a radio frequency (RF) front end module.

20. The co-spiral inductor structure of claim 19, in which the RF front end module is incorporated into at least one of a music player, a video player, an entertainment unit, a navigation device, a communications device, a personal digital assistant (PDA), a fixed location data unit, a mobile phone, and a portable computer.

21. A skewed, co-spiral inductor structure, comprising:
means for supporting;
a first trace arranged in a first spiral pattern on the supporting means;
a second trace arranged in a second spiral pattern, the second trace having a same width as the first trace, the first trace overlapping with the second trace in a plurality of orthogonal overlap areas, each orthogonal overlap area having a size defined by the width of the first trace and the width of the second trace, each orthogonal overlap area orthogonal to an adjacent portion of the first trace and an adjacent portion of the second trace, in which straight, parallel edge of the first trace and the second trace partially overlaps by a predetermined amount in a reduced footprint of the skewed, co-spiral inductor structure; and
means for electrically coupling the second trace to the first trace.

22. The co-spiral inductor structure of claim 21, in which a thickness of the first trace is within a range of ten (10) to twenty (20) micrometers.

23. The co-spiral inductor structure of claim 21, in which the width of the first trace and the width of the second trace is within a range of twenty (20) to one hundred (100) micrometers.

24. The co-spiral inductor structure of claim 21, in which a spacing between the second trace and the first trace is within a range of three (3) to ten (10) micrometers.

25. The co-spiral inductor structure of claim 21, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

* * * * *